United States Patent
Fuse et al.

(10) Patent No.: US 6,687,465 B2
(45) Date of Patent: *Feb. 3, 2004

(54) FM MODULATOR

(75) Inventors: Masaru Fuse, Toyonaka (JP); Kuniaki Utsumi, Sanda (JP); Satoshi Furusawa, Osaka (JP)

(73) Assignee: Matsushita Electric Industrial Co., Ltd., Osaka-fu (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/294,759

(22) Filed: Nov. 15, 2002

(65) Prior Publication Data

US 2003/0067661 A1 Apr. 10, 2003

Related U.S. Application Data (63) Continuation of application No. 09/140,658, filed on Aug. 26, 1998.

(30) Foreign Application Priority Data

Aug. 28, 1997 (JP) ............................................. 9-232577

(51) Int. Cl.$^7$ ............................................. H04B 10/04
(52) U.S. Cl. ...................................... 398/187; 398/201
(58) Field of Search ............................... 398/187, 204, 398/201; 359/278

(56) References Cited

U.S. PATENT DOCUMENTS

| | | | |
|---|---|---|---|
| 5,396,361 A | 3/1995 | Sasaki et al. | 398/1 |
| 5,422,752 A | 6/1995 | Hardcastle | 398/187 |
| 5,526,158 A | 6/1996 | Lembo | 398/204 |
| 5,896,216 A | 4/1999 | Kikushima et al. | 398/176 |
| 5,923,458 A | 7/1999 | Fuse et al. | 359/278 |
| 5,973,820 A | 10/1999 | Fuse et al. | 359/278 |
| 6,014,243 A | 1/2000 | Saeki | 359/278 |
| 6,512,621 B1 * | 1/2003 | Fuse et al. | 398/187 |

FOREIGN PATENT DOCUMENTS

| | | |
|---|---|---|
| EP | 0 503 512 | 9/1992 |
| EP | 0 792 069 | 8/1997 |
| EP | 0 800 315 | 10/1997 |
| JP | 4-346525 | 12/1992 |
| JP | 9-46300 | 2/1997 |
| JP | 10-56424 | 2/1998 |

OTHER PUBLICATIONS

K. Kikushima et al., "Optical Super Wide–Bank FM Modulation Scheme and Its Application to Multi–Channel AM Video Transmission Systems", IOOC '95 Technical Digest, vol. 5, PD2–7, pp. 33 and 34.

* cited by examiner

Primary Examiner—Jason Chan
Assistant Examiner—Christina Y Leung
(74) Attorney, Agent, or Firm—Wenderoth, Lind & Ponack, L.L.P.

(57) ABSTRACT

A branch portion 101 branches an inputted electrical signal into an in-phase signal and an opposite phase signal which have an opposite relation as to a phase. A first FM laser 104 converts the in-phase signal into an optical frequency-modulated signal (a first optical signal) having a center wavelength $\lambda 1$ and then outputs the resultant signal. A second FM laser 105 converts the opposite phase signal into an optical frequency-modulated signal (a second signal) having a center wavelength $\lambda 2$ and then outputs the resultant signal. The two optical signals are combined and then inputted into an optical-electrical converting portion 106. The optical-electrical converting portion 106 subjects the inputted optical signals to optical heterodyne detection by its square-law detection characteristic, and outputs a beat signal between the two optical signals which is a wide-band FM signal at a frequency corresponding to a wavelength difference $\Delta\lambda(=|\lambda 1-\lambda 2|)$ between the first optical signal and the second optical signal. It is thus possible to increase frequency deviation of the outputted FM signal and thus greatly improve a CNR.

21 Claims, 7 Drawing Sheets

SPECTRUM OF OPTICAL FREQUENCY-MODULATED
SIGNAL FROM FIRST FM LASER 104

FIG. 2b

SPECTRUM OF OPTICAL FREQUENCY-MODULATED
SIGNAL FROM SECOND FM LASER 105

FIG. 2c

SPECTRUM OF WIDE-BAND FM SIGNAL FROM
OPTICAL-ELECTRICAL CONVERTING PORTION 106

FM MODULATOR

This is a Rule 1.53(b) Continuation Application of Ser. No. 09/140,658, Filed August 26, 1998.

BACKGROUND OF THE INVENTION

1. Field of the Invention

The present invention relates to FM modulators, and more specifically to an FM modulator for generating a wide-band frequency-modulated signal (hereinafter referred to as an FM signal) using a semiconductor laser and optical heterodyne detection.

2. Description of the Background Art

Figure 7:
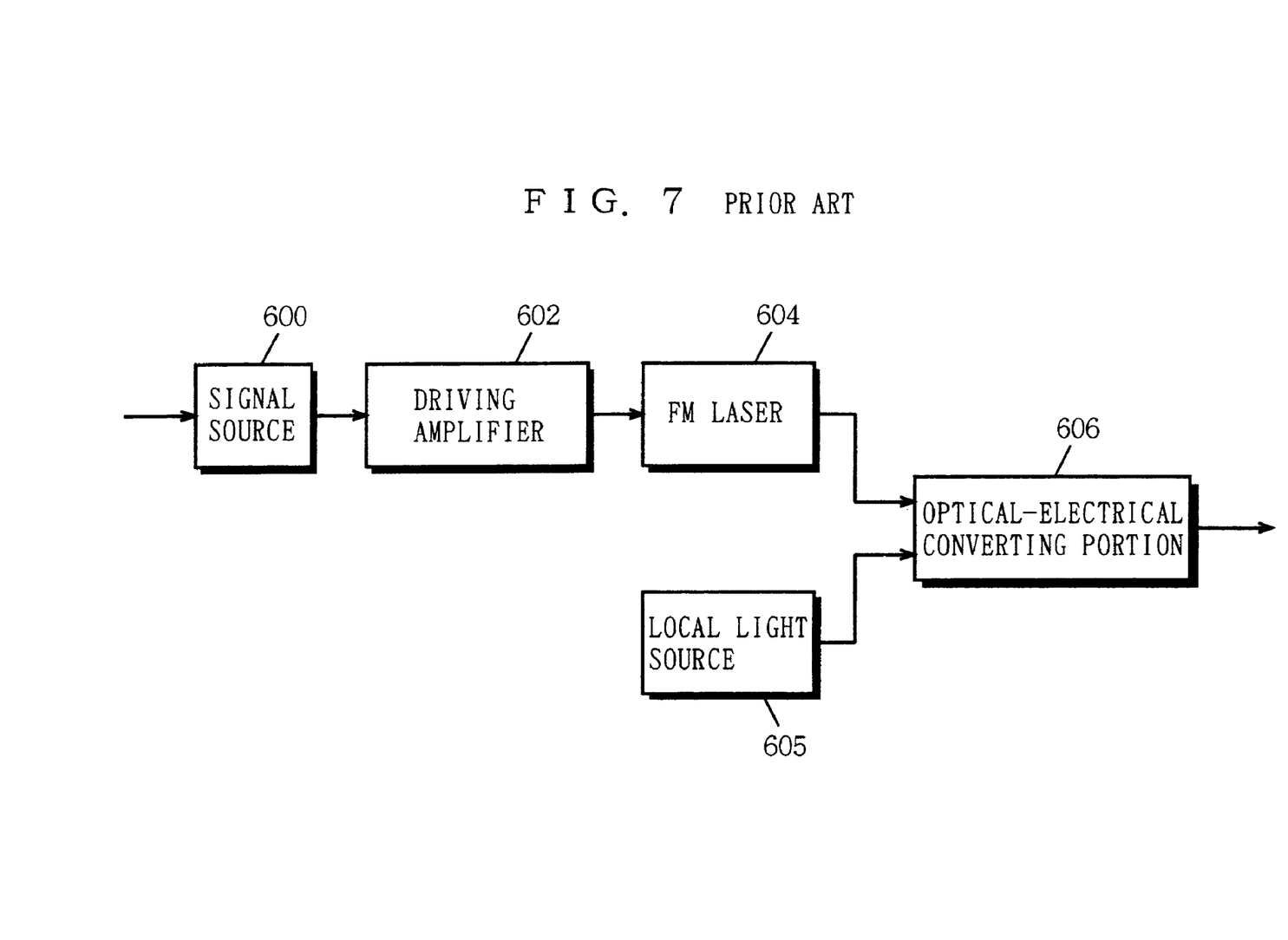
FIG. 7 is a block diagram showing the structure of a conventional FM modulator.

FIG. 7 is a block diagram showing the structure of a conventional FM modulator. The FM modulator with this structure is shown, for example, in a reference (K. Kikushima, et al, "Optical Super Wide-Band FM Modulation Scheme and Its Application to Multi-Channel AM Video Transmission Systems", IOOC '95 Technical Digest, Vol. 5, PD2-7, pp.33–34). In FIG. 7, the FM modulator includes a signal source 600, a driving amplifier 602, a frequency modulation laser (hereinafter referred to as an FM laser) 604, a local light source 605, and an optical-electrical converting portion 606.

In the above structured FM modulator, the signal source 600 outputs an electrical signal which is an original signal for FM modulation and the driving amplifier 602 amplifies the electrical signal. The FM laser 604, which is structured of a semiconductor laser element and the like, for example, oscillates light having a wavelength $\lambda 1$ on condition that an injection current is constant. When the injection current is amplitude-modulated, the outputted light is modulated in an oscillation wavelength (optical frequency) as well as in intensity, and the FM laser 604 outputs an optical frequency-modulated signal having the wavelength $\lambda 1$ at the center. The local light source 605 outputs unmodulated light having a wavelength $\lambda 0$ which is different from the oscillation wavelength $\lambda 1$ of the FM laser 604 by a prescribed amount $\Delta\lambda 1$. The outputted optical signal from the FM laser 604 and the outputted light from the local light source 605 are combined to be inputted to the optical-electrical converting portion 606. The optical-electrical converting portion 606 is structured of a photodiode having a square-law detection characteristic, and the like, and generally has the properties of converting an optical intensity modulation component of the inputted light into a current amplitude modulation component (hereinafter referred to as an optical intensity modulation/direct detection component: an IM-DD component) and, when two lightwaves having different wavelengths are inputted, generating a beat component of the two lightwaves at a frequency corresponding to the wavelength difference (this operation is called an optical heterodyne detection). Accordingly, the optical-electrical converting portion 606 outputs the beat signal of the outputted optical signal from the FM laser 604 and the outputted light from the local light source 605 at a frequency corresponding to the wavelength difference $\Delta\lambda$ between the two lightwaves.

The beat signal obtained as described above is an FM signal taking the electrical signal from the signal source 600 as an original signal. Therefore, by using the appropriate FM laser 604 and local light source 605, it is possible to easily generate a high-frequency and wide-band FM signal having a center frequency (carrier frequency) more than several GHz and frequency deviation more than several hundred MHZ, which it is difficult to realize in an FM modulator with an ordinary electric circuit.

In the conventional FM modulator having the above structure, a carrier-to-noise ratio (hereinafter referred to as a CNR), which shows the quality of the FM signal, is improved as the frequency deviation in the FM laser 604 increases and as spectral line widths of the FM laser 604 and the local light source 605 become narrower. The spectral line widths of these two light sources are parameters depending on the composition and structure of each light source and cannot be changed greatly by limitations such as use conditions and the like. However, if the amplitude of the inputted signal to the FM laser 604 is increased, it is possible to increase the frequency deviation and thus improve the CNR. However, since the laser light source has a threshold characteristic, when the amplitude of the inputted signal is increased to more than a prescribed degree, a distortion characteristic is extremely deteriorated due to clipping of the signal amplitude and the like. Furthermore, the outputted signal level of the driving amplifier 602 has a limit (saturated level), and if the outputted signal level is increased over a prescribed level, the distortion characteristic is sharply deteriorated. Therefore, the amplitude increase of the inputted signal to the FM laser 604 is limited, and it is thus disadvantageously difficult to improve the CNR to more than a prescribed degree.

SUMMARY OF THE INVENTION

Therefore, an object of the present invention is to provide an FM modulator capable of further improving a CNR.

In order to achieve the above object, the present invention has the following feature.

A first aspect of the present invention is to an FM modulator for converting an electrical signal into a frequency-modulated signal by an optical heterodyne method, comprising:

- a branch portion for outputting, when the electrical signal is inputted, a phase-uninverted signal (hereinafter referred to as an in-phase signal) and a phase-inverted signal (hereinafter referred to as an opposite phase signal);
- a first frequency modulation light source element (hereinafter referred to as a first FM light source element) having a property of uniquely converting an amplitude change in the inputted electrical signal into an optical frequency change of outputted light, for converting the in-phase signal into a frequency-modulated first optical signal having a center wavelength $\lambda 1$;
- a second frequency modulation light source element (hereinafter referred to as a second FM light source element) having a property of uniquely converting an amplitude change in the inputted electrical signal into an optical frequency change of outputted light, for converting the opposite phase signal into a frequency-modulated second optical signal having a center wavelength $\lambda 2$; and
- an optical-electrical converting portion for subjecting the first and second optical signals to optical heterodyne detection and then generating a beat signal at a frequency corresponding to a wavelength difference $\Delta\lambda(=|\lambda 1-\lambda 2|)$ between both of the optical signals.

As described above, in accordance with the first aspect, since the first and second FM light source elements perform modulating operation by electrical signals having an opposite phase relationship with each other, polarities of the frequency deviation in outputted lightwaves (the first and second optical signals) from the first and second FM light source elements also have an opposite phase relationship with each other. That is, when the first optical signal is deviated to a high frequency side, the second optical signal is deviated to a low frequency side, and on the contrary, when the first optical signal is deviated to a low frequency side, the second optical signal is deviated to a high frequency side. Therefore, in the optical-electrical converting portion, the frequency deviation of a beat signal obtained as a difference signal between these two optical signals is the sum of the frequency deviation of the first optical signal and the frequency deviation of the second optical signal. Therefore, compared to the conventional FM modulator, the frequency deviation of the outputted signal is increased, allowing great improvement in a CNR performance.

According to a second aspect of the present invention, in the first aspect, the FM modulator further comprises an amplitude adjusting portion inserted at least either between the branch portion and the first FM light source element or between the branch portion and the second FM light source element, for adjusting amplitude of the inputted electrical signal to equate frequency deviation of the first and second optical signals.

As described above, in accordance with the second aspect, the amplitudes of the electrical signal inputted into the first and second FM light source elements are appropriately adjusted to equate the frequency deviation in the first and second optical signals. Thus, also when light source elements whose amounts of wavelength chirping (a frequency change ratio with respect to inputted current amplitude) are different are used as the first and second FM light source elements, the frequency deviations of the optical signals are equal. As a result, in the optical-electrical converting portion, the frequency deviation of a beat signal obtained as a difference signal between these two optical signals is increased twice compared to that in the conventional FM modulator. Further, by making the frequency changes in the first and second FM light source elements symmetrical, it is possible to reduce a distortion generated in each of the first and second FM light source elements in current/optical frequency converting operation According to a third aspect of the present invention, in the first aspect, the FM modulator further comprises a delay adjusting portion inserted on at least either a first route from the branch portion through the first FM light source element to the optical-electrical converting portion or a second route from the branch portion through the second FM light source element to the optical-electrical converting portion, for adjusting propagation delay of a signal propagated on the route to equate propagation delay included in the first route and propagation delay included in the second route.

In the above third aspect, by adjusting propagation delay at an appropriate position on two propagation routes from the branch portion to the optical-electrical converting portion to equate propagation time on both propagation routes, it is possible to more ideally generate a wide-band FM signal with its frequency deviation expanded.

According to a fourth aspect, in the first aspect, the FM modulator further comprises a level adjusting portion inserted on at least either a first route from the branch portion through the first FM light source element to the optical-electrical converting portion or a second route from the branch portion through the second FM light source element to the optical-electrical converting portion, for adjusting signal power to equate an amplitude of an optical intensity modulation/direct detection component outputted by subjecting an optical intensity modulation component included in the first optical signal to square-law detection in the optical-electrical converting portion and an amplitude of an optical intensity modulation/direct detection component outputted by subjecting an optical intensity modulation component included in the second optical signal to square-law detection in the optical-electrical converting portion.

Since a semiconductor laser can easily generate an optical frequency-modulated signal by modulating its injection current, it is suitable for the first and second FM light element. However, when the injection current to the semiconductor laser is subjected to modulation, the outputted light is subjected to modulation in intensity, and when the resultant light is subjected to square-law detection in the optical-electrical converting portion, an optical intensity modulation/direct detection component (IM-DD component) is generated. The IM-DD component is an unwanted signal with respect to the wide-band FM signal, deteriorating the quality of the FM demodulation signal.

When the first and second FM light sources perform modulating operation by electrical signals whose phases are opposite, the first and second IIM-DD components also have an opposite phase relationship with each other. Therefore, in the above fourth aspect, signal power is adjusted at appropriate positions on two propagation routes from the branch portion to the optical-electrical converting portion to equate the magnitudes of the first and second IM-DD components, and these components are canceled/suppressed in the optical-electrical converting portion. It is thus possible to generate a wide-band FM signal with high quality without an unwanted signal.

A fifth aspect of the present invention is an FM modulator for converting an electrical signal into a frequency-modulated signal by an optical heterodyne method, comprising:

a branch portion for outputting, when the electrical signal is inputted, a phase-uninverted signal (hereinafter referred to as an in-phase signal) and a phase-inverted signal (hereinafter referred to as an opposite phase signal);

a first light source for outputting unmodulated light with a wavelength $\lambda 1$;

a first optical phase modulating portion having a property of uniquely converting an amplitude change in the inputted electrical signal into an optical phase change of outputted light, for converting, when outputted light from the first light source is inputted, the in-phase signal into a phase-modulated first optical signal having a center frequency $\lambda 1$;

a second light source for outputting unmodulated light with a wavelength $\lambda 2$;

a second optical phase modulating portion having a property of uniquely converting an amplitude change in the outputted electrical signal into an optical phase change of inputted light, for converting, when outputted light from the second light source is inputted, the opposite phase signal into a phase-modulated second optical signal having a center frequency $\lambda 2$; and an optical-electrical converting portion for subjecting the first and second optical signals to optical heterodyne detection and then generating a beat signal at a frequency corresponding to a wavelength difference $\Delta\lambda(=|\lambda 1-\lambda 2|)$ between both optical signals.

In the above described first to fourth aspects, as a method for producing an optical frequency-modulated signal, a structure is adopted in which a wavelength chirping characteristic of the FM light source element (for example, a semiconductor laser) is used and subjected to direct modulation. Another structure can be thought in which an external optical phase modulator is used in order to produce an optical frequency-modulated signal. As is generally well known, frequency modulation and phase modulation can be thought substantially the same.

Therefore, in the fifth aspect, in place of the first and second FM light source elements, the first and second optical phase modulating portions are provided with unmodulated light from the first and second light sources, respectively, and then subject the light to optical phase modulation. Since the first and second optical phase modulating portions perform modulating operation by electrical signals whose phases are opposite, polarities of frequency deviation in their outputted lights also have an opposite phase relationship with each other. Therefore, as in the fifth aspect, the frequency deviation of the beat signal obtained as a difference signal between these two optical signals is the sum of the frequency deviation of the outputted light from the first optical phase modulating portion and the frequency deviation of the outputted light from the second optical phase modulating portion. Thus, the frequency deviation of the outputted signal is increased compared to the conventional FM modulator, allowing great improvement in a CNR performance.

According to a sixth aspect of the present invention, in the fifth aspect, the FM modulator further comprises an amplitude adjusting portion inserted at least either between the branch portion and the first optical phase modulation portion or between the branch portion and the second optical phase modulation portion, for adjusting amplitude of the inputted electrical signal to equate frequency deviation of the first and second optical signals.

As described above, according to the sixth aspect, the amplitudes of the electrical signals inputted into the first and second optical phase modulation portions are appropriately adjusted to equate the frequency deviation in the first and second optical signals. Thus, also when external optical phase modulators whose optical phase modulation efficiencies are different are used as the first and second optical phase modulating portions, the frequency deviations of the optical signals are equal. As a result, in the optical-electrical converting portion, the frequency deviation of a beat signal obtained as a difference signal between these two optical signals is increased twice compared to that in the conventional FM modulator. Further, by making the frequency changes in the first and second optical phase modulating portions symmetrical, it is possible to reduce a distortion generated in each of the first and second optical phase modulating portions in voltage/optical frequency converting operation.

According to a seventh aspect of the present invention, in the fifth aspect, the FM modulator further comprises a delay adjusting portion inserted on at least either a first route from the branch portion through the first optical phase modulation portion to the optical-electrical converting portion or a second route from the branch portion through the second optical phase modulation portion to the optical-electrical converting portion, for adjusting propagation delay of a signal propagated on the routes to equate propagation delay included in the first route and propagation delay included in the second route.

In the above seventh aspect, by adjusting propagation delay at an appropriate position on two propagation routes from the branch portion to the optical-electrical converting portion to equate propagation time on both propagation routes, it is possible to more ideally generate a wide-band FM signal with its frequency deviation expanded.

These and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
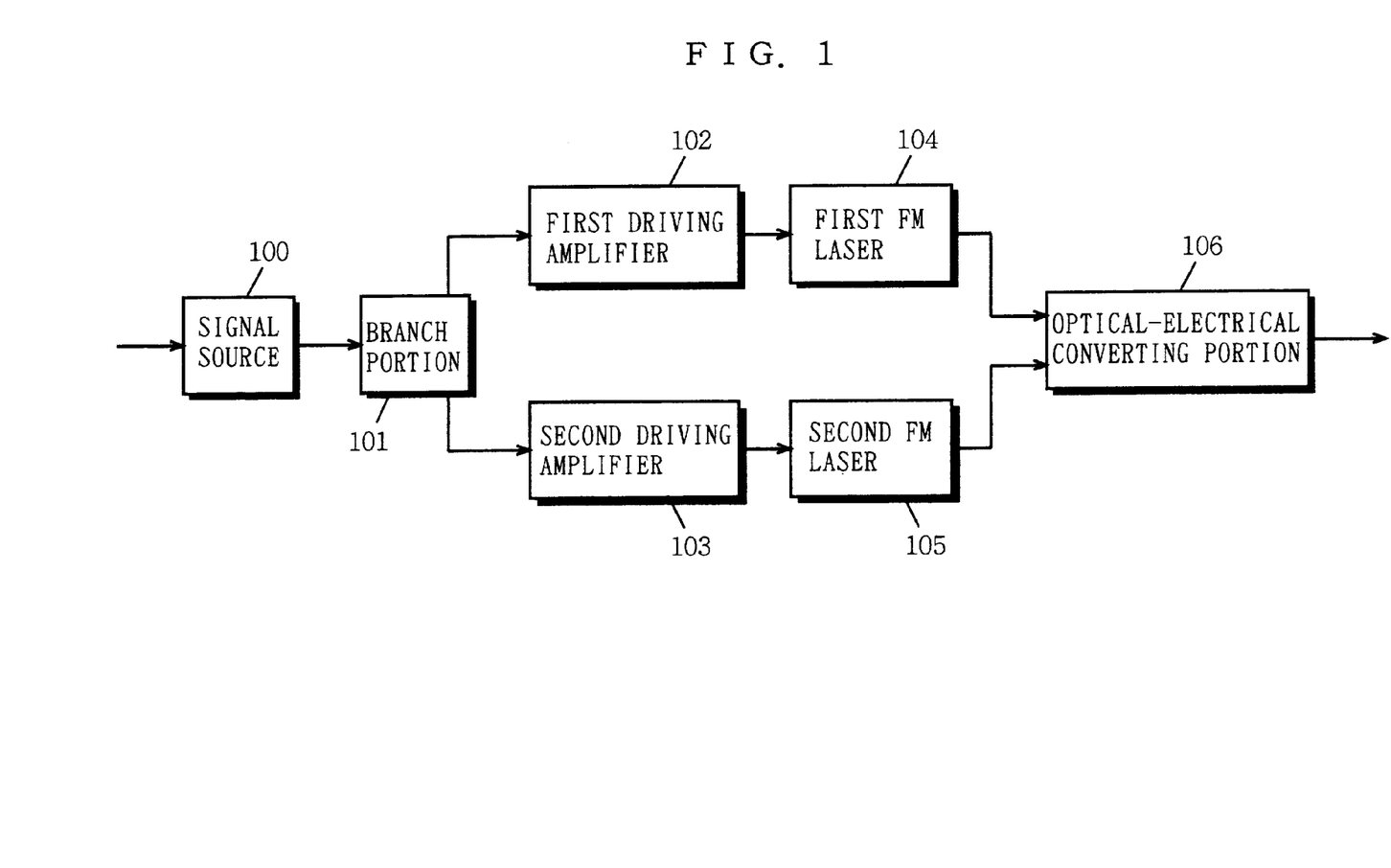
FIG. 1 is a block diagram showing the structure of an FM modulator according to a first embodiment of the present invention.

FIG. 1 is a block diagram showing the structure of an FM modulator according to a first embodiment of the present invention. In FIG. 1, the FM modulator of the present embodiment includes a signal source 100, a branch portion 101, a first frequency modulation laser (hereinafter referred to as a first FM laser) 104, a second frequency modulation laser (hereinafter referred to as a second FM laser) 105, and an optical-electrical converting portion 106. Further, as required, the FM modulator includes first and second driving amplifiers 102 and 103.

Described next is operation of the embodiment shown in FIG. 1. The signal source 100 outputs an electrical signal which is an original signal for FM modulation. The branch portion 101 branches the electrical signal outputted from the signal source 100 into a phase-uninverted signal (in-phase signal) and a phase-inverted signal (opposite phase signal) and outputs each of these signals. The first and second driving amplifiers 102 and 103 are inserted as required between the branch portion 101 and the first FM laser 104 and between the branch portion 101 and the second FM laser 105, respectively, when the magnitude of the in-phase signal and the opposite phase signal outputted from the branch portion 101 is not sufficient with respect to the required frequency deviation of the first or the second FM lasers 104 and 105, and the like. The first and second driving amplifiers 102 and 103 amplify the in-phase signal and the opposite phase signal outputted from the branch portion 101, and then outputs these signals to the first and second FM lasers 104 and 105, respectively.

Figure 2A:
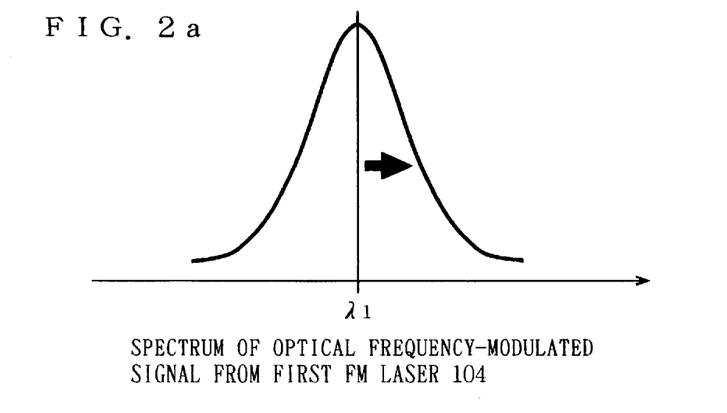
FIGS. 2a to 2c are diagrams for describing operation of the first embodiment.
Figure 2B:
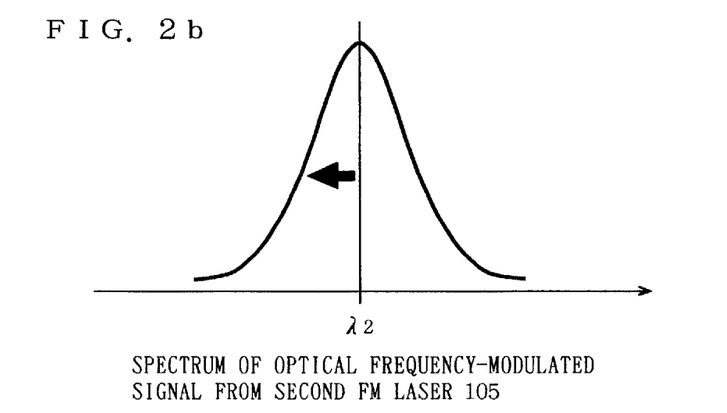
Figure 2C:
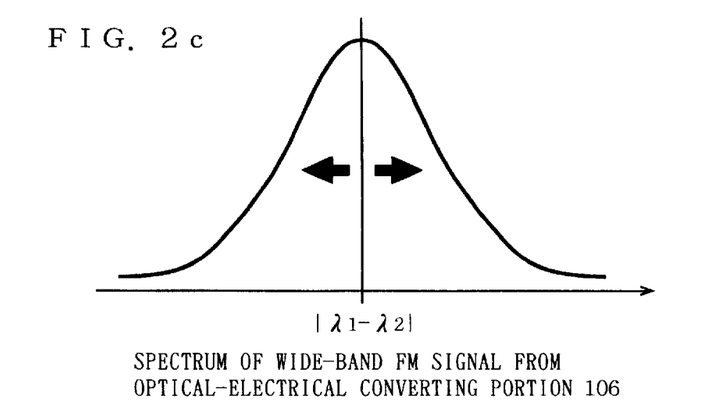

The first and second FM lasers 104 and 105, which are typically structured of a semiconductor laser, oscillate light having a constant wavelength under the condition that an injection current is constant. When the injection current is amplitude-modulated by the electrical signal, the outputted light is modulated in its oscillation wavelength (optical frequency) as well as in intensity, and the lasers output an optical frequency-modulated signal. The first FM laser 104 outputs an optical frequency-modulated signal subjected to modulation with the above in-phase signal and having a center wavelength λ1 (refer to FIG. 2a: hereinafter referred to as a first optical signal), and the second FM laser 105 outputs an optical frequency-modulating signal subjected to modulation by the above opposite phase signal and having a center wavelength λ2 (refer to FIG. 2b: hereinafter referred to as a second optical signal). At this time, polarities of frequency deviation in the first and second optical signals have an opposite phase relationship each other, and when the first optical signal is deviated to a high frequency side, the second optical signal is deviated to a low frequency side (as shown by arrows in FIGS. 2a and 2b). On the contrary, when the first optical signal is deviated to a low frequency side, the second optical signal is deviated to a high frequency side. The first and second optical signals are combined and then subjected to optical heterodyne detection by a square-law detection characteristic of the optical-electrical converting portion 106. At a frequency corresponding to a wavelength difference Δλ(=|λ1−λ2|) between the first optical signal and the second optical signal, the optical-electrical converting portion 106 outputs a wide-band FM signal which is a beat (difference) signal between two optical signals (refer to FIG. 2c). The frequency deviation of the wide-band FM signal is the sum of frequency deviation of the first and second optical signals.

As described above, according to the first embodiment, both of the first and second FM lasers are subjected to modulation by electrical signals which have an opposite phase relationship with each other, and it is thereby possible to expand the frequency deviation of the outputted signal and thus greatly improve the CNR performance.

(Second Embodiment)

Figure 3:
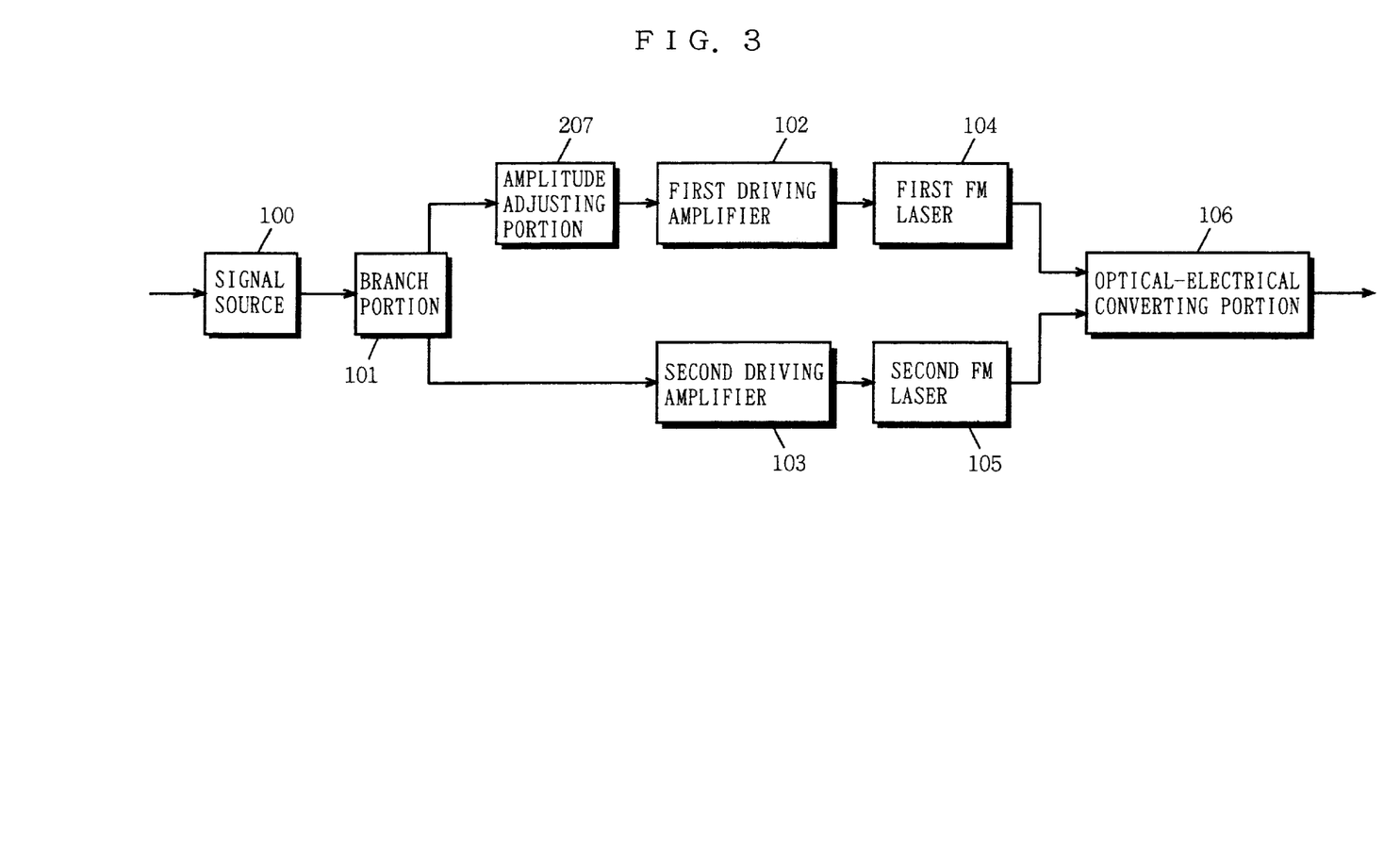
FIG. 3 is a block diagram showing the structure of an FM modulator according to a second embodiment of the present invention.

FIG. 3 is a block diagram showing the structure of an FM modulator according to the second embodiment of the present invention. In FIG. 3, the FM modulator of the present embodiment includes, in addition to the structure in FIG. 1, an amplitude adjusting portion 207.

Described next is operation of the embodiment shown in FIG. 3. Since most part of the structure in the present embodiment is the same as that of the above described first embodiment, only different operation is described below. The amplitude adjusting portion 207 adjusts a signal amplitude level of the in-phase signal outputted from the branch portion 101 to equate frequency deviation of the first and second optical signals. The same effect can be obtained when the amplitude adjusting portion 207 is inserted between the first driving amplifier 102 and the first FM laser 104. Further, according to the characteristic of the semiconductor laser used as the first and second FM lasers 104 and 105, the amplitude adjusting portion 207 may be inserted between the branch portion 101 and the second FM laser 105 to have the structure for adjusting the amplitude of the opposite phase signal or to have the structure for adjusting the amplitudes of both of the in-phase signal and the opposite phase signal.

(Third Embodiment)

Figure 4:
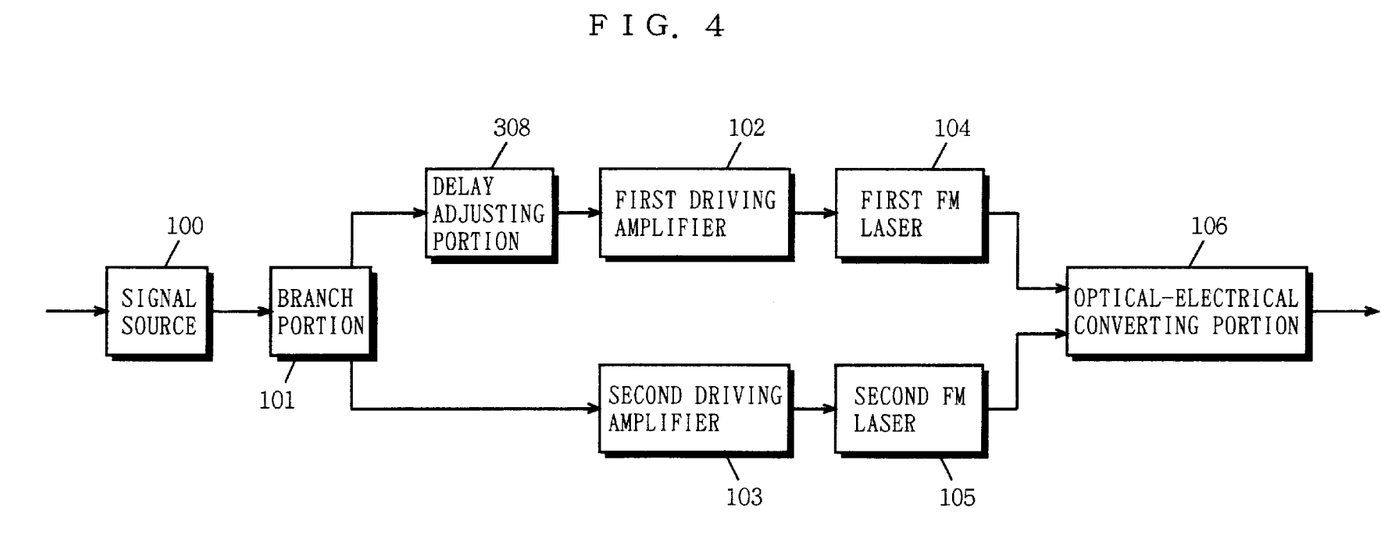
FIG. 4 is a block diagram showing the structure of an FM modulator according to a third embodiment of the present invention.

FIG. 4 is a block diagram showing the structure of an FM modulator according to the third embodiment of the present invention. In FIG. 4, the FM modulator of the present embodiment includes, in addition to the structure in FIG. 1, a delay adjusting portion 308.

Described next is operation of the embodiment shown in FIG. 4. Since most part of the structure of the present embodiment is the same as that of the above described first embodiment, only different operation is described below. The delay adjusting portion 308 adds appropriate propagation delay to the in-phase signal outputted from the branch portion 101 to equate propagation delay with which the in-phase signal outputted from the branch portion 101 reaches through the first FM laser 104 the optical-electrical converting portion 106 and propagation delay with which the opposite phase signal outputted from the branch portion 101 reaches through the second FM laser 105 the optical-electrical converting portion 106. The same effect can be obtained when the delay adjusting portion 308 is inserted between the first driving amplifier 102 and the first FM laser 104 or between the first FM laser 104 and the optical-electrical converting portion 106. Further, the delay adjusting portion 308 may be inserted between the branch portion 101 and the second FM laser 105 or between the second FM laser 105 and the optical-electrical converting portion 106 to have the structure for adjusting the propagation delay of the opposite phase signal or to have the structure for adjusting the propagation delay of both of the in-phase signal and the opposite phase signal.

(Fourth Embodiment)

Figure 5:
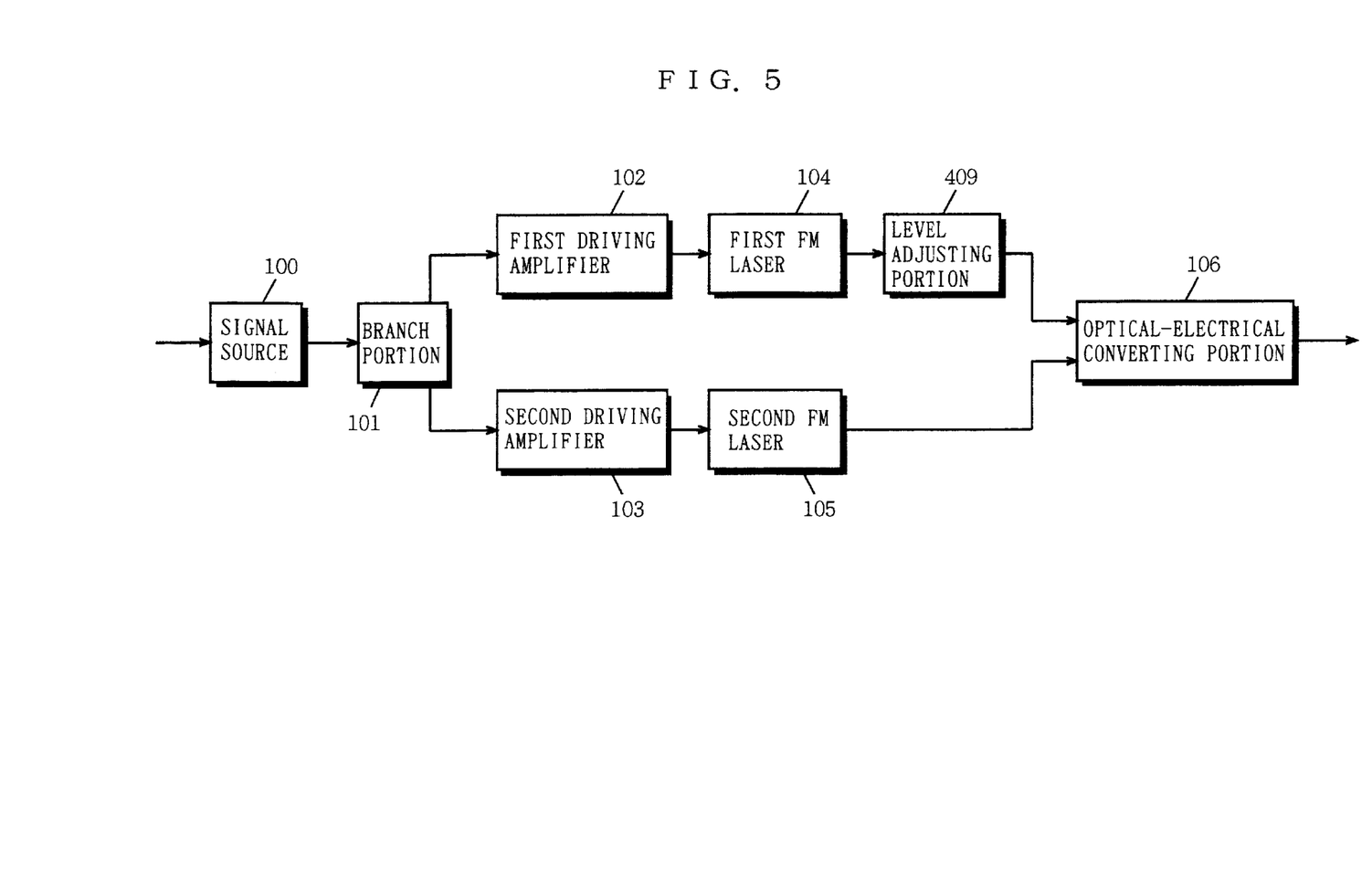
FIG. 5 is a block diagram showing the structure of an FM modulator according to a fourth embodiment of the present invention.

FIG. 5 is a block diagram showing the structure of an FM modulator according to a fourth embodiment of the present invention. In FIG. 5, the FM modulator of the present embodiment includes, in addition to the structure in FIG. 1, a level adjusting portion 409.

Described next is operation of the embodiment shown in FIG. 5. Since most part of the structure of the present embodiment is the same as that of the above described first embodiment, only different operation is described below. The level adjusting portion 409 adjusts power of the first optical signal outputted from the first FM laser to equate the magnitude of a first IM-DD component by the first optical signal outputted from the optical-electrical converting portion 106 and the magnitude of a second IM-DD component by the second optical signal outputted from the optical-electrical converting portion 106. The level adjusting portion 409 may be inserted between the branch portion 101 and the first FM laser 104. Further, the level adjusting portion 409 may be inserted between the branch portion 101 and the second FM laser 105 or between the second FM laser 105 and the optical-electrical converting portion 106 to have the structure for adjusting power of the opposite phase signal or to have the structure for adjusting power of both of the in-phase signal and the opposite phase signal.

By appropriately setting a bias current of each semiconductor laser used as the first and second FM lasers 104 and 105 and received light power of the first and second optical signals into the optical-electrical converting portion 106, it is possible to use the level adjusting portion 409 also as the amplitude adjusting portion 207 described in the second embodiment.

(Fifth Embodiment)

Figure 6:
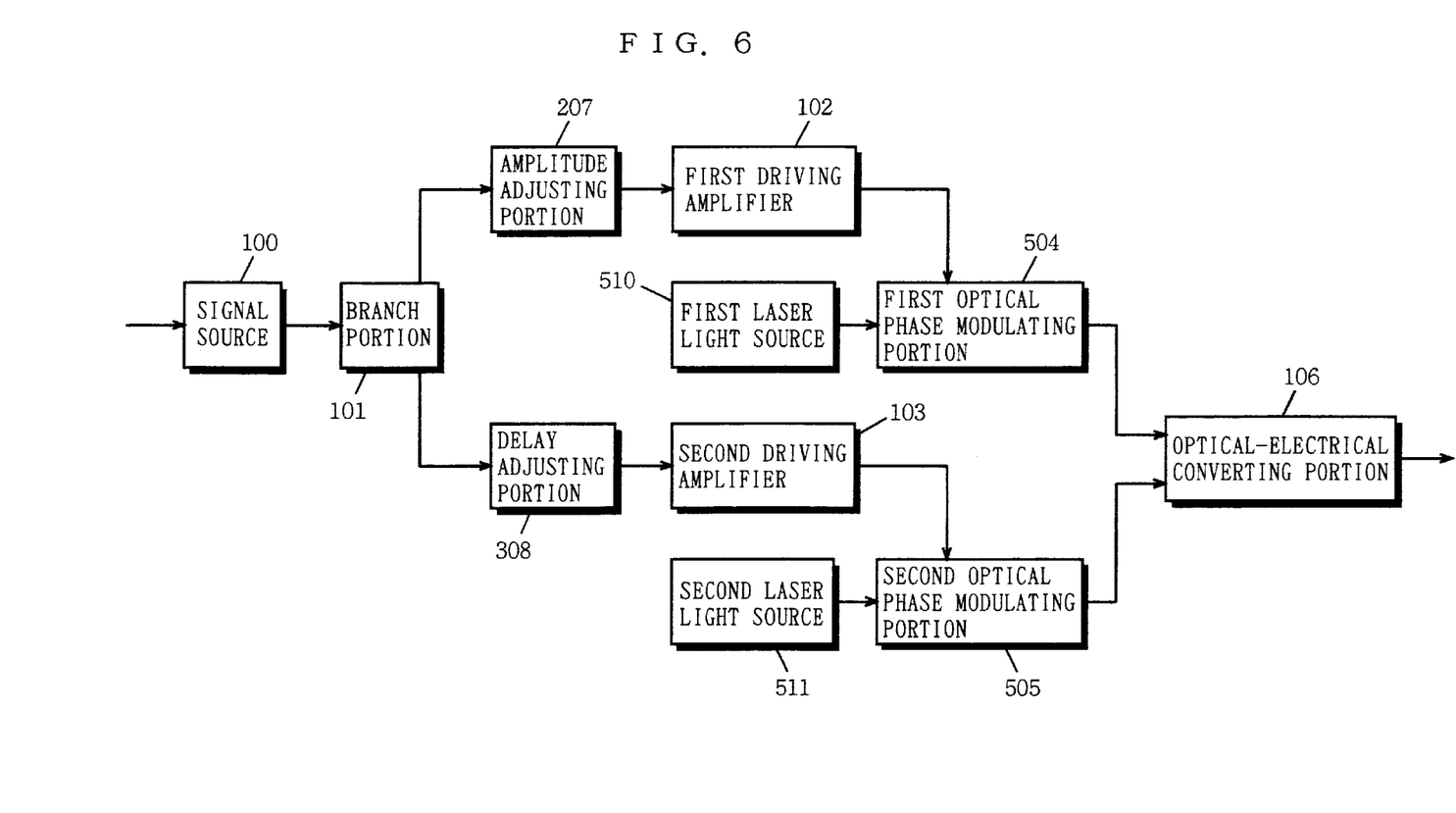
FIG. 6 is a block diagram showing the structure of an FM modulator according to a fifth embodiment of the present invention.

FIG. 6 is a block diagram showing the structure of an FM modulator according to a fifth embodiment of the present invention. In FIG. 6, the FM modulator of the present invention includes, in place of the first and second FM lasers 104 and 105, a first laser light source 510, a first optical phase modulating portion 504, a second laser light source 511, and a second optical phase modulating portion 505. Further, as in the above second and third embodiments, the FM modulator includes the amplitude adjusting portion 207 and the delay adjusting portion 308.

Described next is operation of the embodiment shown in FIG. 6. The structure of the present embodiment is basically the same as that of the above described first (second or third) embodiment, but as a method for converting an electrical signal into an optical signal, an "external modulating method" is taken, which is different from the first embodiment (on the other hand, as in the first embodiment, a method for converting an electrical signal into an optical signal by modulating an injection current of a light source is called a "direct modulating method"). Further, as generally well known, frequency modulation and phase modulation can be thought to have the same meaning, and thus the present embodiment has the structure in which an optical phase-modulated signal is generated as the first and second optical signals. That is, the first optical phase modulating portion 504 is provided with unmodulated light from the first light source 510, and converts the in-phase signal outputted from the branch portion 101 into a first optical signal which is an optical phase-modulated signal and then outputs the resultant signal, while the second optical phase modulating portion 505 is provided with unmodulated light from the second light source 511, and converts the opposite phase signal outputted from the branch portion 101 into a second optical signal which is an optical phase-modulated signal and then outputs the resultant signal. These two optical signals are then subjected to optical heterodyne detection in the optical-electrical converting portion 106 to generate a wide-band FM signal. The amplitude adjusting portion 207 and the delay adjusting portion 308 are inserted in an appropriate position as required, thereby equating frequency (phase) deviation in the first and second optical signals and equating propagation delay in which the in-phase signal and the opposite phase signal reach from the branch portion 101 to the optical-electrical converting portion 106.

While the invention has been described in detail, the foregoing description is in all aspects illustrative and not restrictive. It is understood that numerous other modifications and variations can be devised without departing from the scope of the invention.

What is claimed is:

1. An FM modulator comprising:
   a first light emitting device which emits a first frequency-modulated optical signal according to a first input signal;
   a second light emitting device which emits a second frequency-modulated optical signal according to a second input signal; and
   an optoelectric conversion circuit which receives said first and said second frequency-modulated optical signals for heterodyne detection;
   wherein said second input signal has a phase inverted to that of said first input signal.

2. The FM modulator of claim 1, further comprising a signal inverting circuit which inverts one of said first and said second input signals.

3. The FM modulator of claim 1, wherein said optoelectric conversion circuit combines said first and said second frequency-modulated optical signals.

4. The FM modulator of claim 1, further comprising a branch portion for branching an original signal into said first and said second input signals.

5. The FM modulator of claim 1, further comprising a 180 degree distributor which distributes an original signal into said first and said second input signals with phases inverted with respect to each other.

6. The FM modulator of claim 1, further comprising:
   a branch portion for branching an original signal into a phase-uninverted signal and a phase-inverted signal;
   a first amplifier which amplifies the phase-uninverted signal; and
   a second amplifier which amplifies the phase-inverted signal,
   wherein outputs of said first and said second amplifiers are utilized as said first and said second input signals.

7. The FM modulator of claim 1, wherein said first and said second light emitting devices have the same input and output characteristics.

8. An FM modulating method comprising:
   a first light emitting step which emits a first frequency-modulated optical signal according to a first input signal;
   a second light emitting step which emits a second frequency-modulated optical signal according to a second input signal; and
   an optoelectric conversion step which receives and mixes said first and said second frequency-modulated optical signals for heterodyne detection,
   wherein said second input signal has a phase inverted to that of said first input signal.

9. The FM modulating method of claim 8, further comprising a step of inverting a phase of said first input signal before the optoelectric conversion step.

10. The FM modulating method of claim 8, wherein said optoelectric conversion step combines said first and said second frequency-modulated optical signals.

11. The FM modulating method of claim 8, further comprising a branching step which branches an original signal into said first and said second input signals.

12. The FM modulating method of claim 8, further comprising a 180 degree distributing step which distributes an original signal into said first and said second input signals with phases inverted with respect to each other.

13. The FM modulating method of claim 8, further comprising:
   a branching step for branching an original signal into a phase-uninverted signal and a phase-inverted signal;
   a first amplifying step which amplifies the phase-uninverted signal; and
   a second amplifying step which amplifies the phase-inverted signal,
   wherein outputs of said first and said second amplifying steps are utilized as said first and said second input signals.

14. The FM modulator of claim 8, wherein said first and said second light emitting steps produce the same input and output characteristics.

15. A video transmission system comprising:
   an FM modulator, wherein said FM modulator comprises;
   a first light emitting device which emits a first frequency-modulated optical signal according to a first input signal;
   a second light emitting device which emits a second frequency-modulated optical signal according to a second input signal; and
   an optoelectric conversion circuit which receives said first and said second frequency-modulated optical signals for heterodyne detection;
   wherein said second input signal has an inverted phase of said first input signal.

16. The video transmission system of claim 15, further comprising in said FM modulator a signal inverting circuit which inverts one of said first and said second input signals.

17. The video transmission system of claim 15, wherein said optoelectric conversion circuit combines said first and said second frequency-modulated optical signals.

18. The video transmission system of claim 15, further comprising in said FM modulator a branch portion for branching an original signal into said first and said second input signals.

19. The video transmission system of claim 15, further comprising in said FM modulator a 180 degree distributor which distributes an original signal into said first and said second input signals with phases inverted with respect to each other.

20. The video transmission system of claim 15, further comprising in said FM modulator:
- a branch portion for branching an original signal into a phase-uninverted signal and a phase-inverted signal;
- a first amplifier which amplifies the phase-uninverted signal; and
- a second amplifier which amplifies the phase-inverted signal,
- wherein outputs of said first and said second amplifiers are utilized as said first and said second input signals.

21. The video transmission system of claim 15, wherein said first and said second light emitting devices have the same input and output characteristics.

* * * * *